(12) United States Patent
Merlin et al.

(10) Patent No.: US 7,132,698 B2
(45) Date of Patent: Nov. 7, 2006

(54) COMPRESSION ASSEMBLED ELECTRONIC PACKAGE HAVING A PLASTIC MOLDED INSULATION RING

(75) Inventors: Mario Merlin, San Carlo Canavese (IT); Aldo Torti, San Carlo Canavese (IT)

(73) Assignee: International Rectifier Corporation, El Segundo, CA (US)

( * ) Notice: Subject to any disclaimer, the term of this patent is extended or adjusted under 35 U.S.C. 154(b) by 113 days.

(21) Appl. No.: 10/680,332

(22) Filed: Oct. 7, 2003

(65) Prior Publication Data

US 2004/0119089 A1 Jun. 24, 2004

Related U.S. Application Data

(63) Continuation-in-part of application No. 10/057,399, filed on Jan. 25, 2002, now Pat. No. 6,781,227.

(51) Int. Cl.
*H01L 29/73* (2006.01)
*H01L 27/082* (2006.01)
*H01L 23/48* (2006.01)
*H01L 23/34* (2006.01)

(52) U.S. Cl. .................. 257/181; 257/177; 257/587; 257/688; 257/692; 257/724

(58) Field of Classification Search ............. 257/181, 257/696, 584, 692, 688, 724
See application file for complete search history.

(56) References Cited

U.S. PATENT DOCUMENTS 3,581,160 A * 5/1971 Piccone et al. ............. 257/683
3,599,057 A * 8/1971 Lootens ..................... 257/689
3,831,067 A * 8/1974 Wislocky et al. ........... 257/682
3,986,201 A * 10/1976 Herold et al. ............... 257/689
4,008,486 A * 2/1977 Byczkowski ................ 257/689
4,240,099 A * 12/1980 Brandt et al. ............... 257/739
4,567,504 A * 1/1986 Egerbacher et al. ........ 257/683
4,775,916 A * 10/1988 Kouzuchi et al. ........... 361/712
5,121,189 A * 6/1992 Niwayama .................. 257/688
5,519,231 A * 5/1996 Nakashima et al. ........ 257/181
5,739,556 A * 4/1998 Bolgiani ..................... 257/182
6,445,013 B1 * 9/2002 Taguchi ..................... 257/138

FOREIGN PATENT DOCUMENTS

| EP | 0096266 | * 12/1983 |
| EP | 0220698 | * 10/1986 |
| JP | 08-186135 | * 1/1996 |

* cited by examiner

*Primary Examiner*—Carl Whitehead, Jr.
*Assistant Examiner*—James M. Mitchell
(74) *Attorney, Agent, or Firm*—Ostrolenk, Faber, Gerb & Soffen, LLP

(57) ABSTRACT

A compression assembled semiconductor package for housing a power semiconductor die which includes two major pole pieces in intimate electrical contact with respective major electrodes of a power semiconductor die. The package includes a plastic molded insulation ring disposed around the power semiconductor die. The pole pieces are secured to respective ends of the plastic molded insulation ring. One of the pole pieces may include an annular flange that penetrates the plastic molded insulation ring from an interior wall thereof and is embedded in its body. The annular flange preferably comprises a projection having a squared tab and circular distal end that is received by a receiving groove having a notch (to receive the squared tab) and a cavity (to receive the distal end).

10 Claims, 4 Drawing Sheets

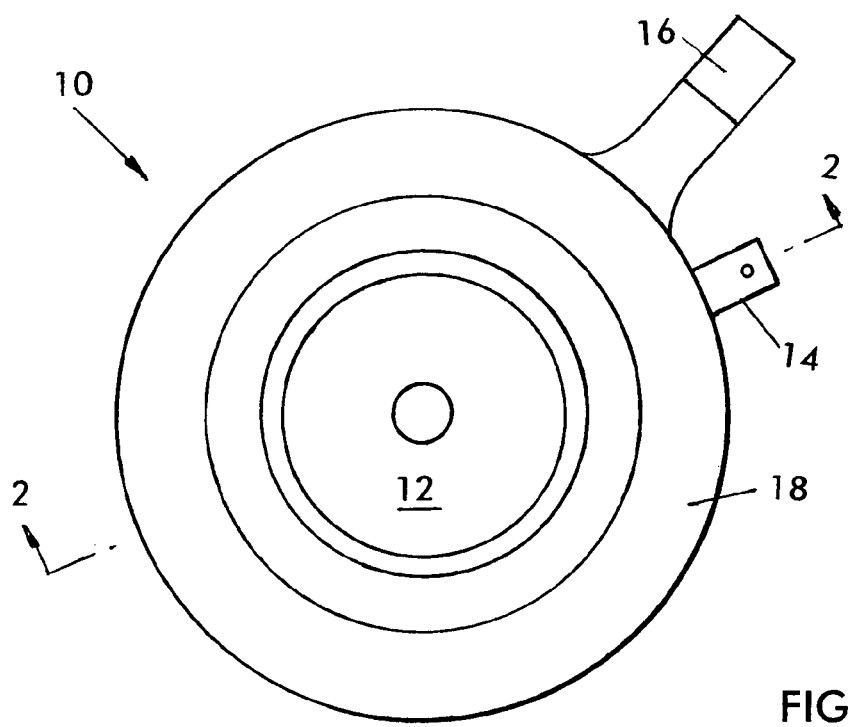
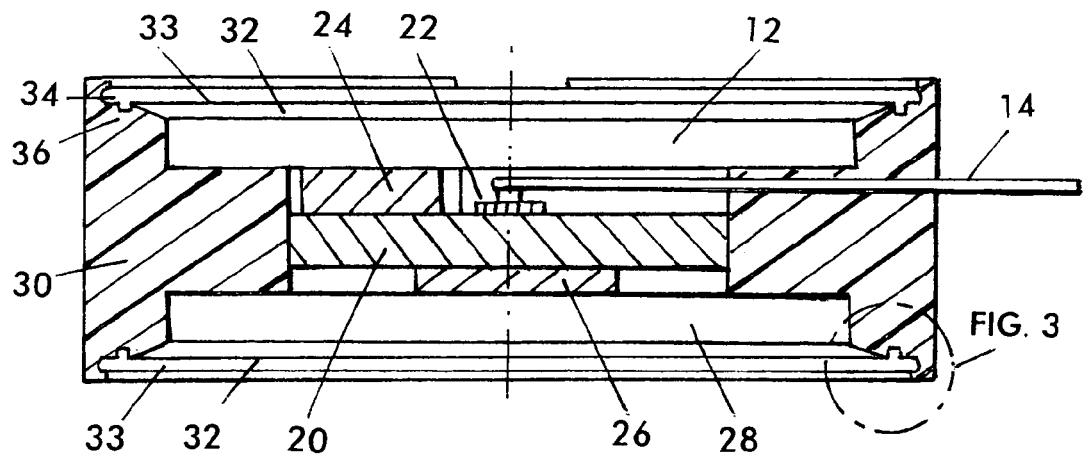
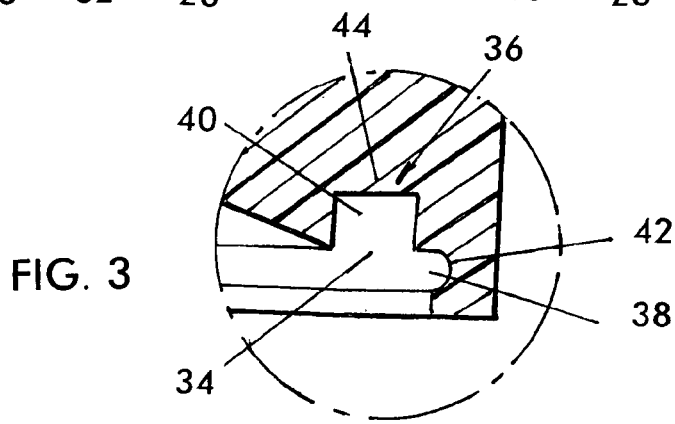

COMPRESSION ASSEMBLED ELECTRONIC PACKAGE HAVING A PLASTIC MOLDED INSULATION RING

CROSS-REFERENCE TO RELATED APPLICATIONS

The present application is a continuation-in-part of U.S. patent application Ser. No. 10/057,399, filed Jan. 25, 2002 now U.S. Pat. No. 6,781,227 and entitled "COMPRESSION ASSEMBLED ELECTRONIC PACKAGE HAVING A PLASTIC MOLDED INSULATION RING," the entire contents of which is incorporated herein by reference.

BACKGROUND OF THE INVENTION

This application relates to high power compression assembled semiconductor packages, and more particularly to a compression assembled semiconductor package that houses a high power semiconductor die.

Compression assembled packages for housing high power semiconductor elements are well known. These packages generally resemble a hockey puck, are occasionally referred to as such, and typically include a power semiconductor die, which may be a thyristor, having a control electrode and a major electrode on a major surface thereof, and another major electrode on the die's opposing major surface. Diode die are another example of die which are used in such packages. Also, typically, in these packages, two relatively large pole pieces are pressed by outside supports in surface-to-surface electrical contact with the major electrodes of the semiconductor die.

Typically, an annular insulation ring comprising a ceramic dielectric is disposed around the semiconductor die. The pole pieces are then directly connected to respective ends of the annular insulation ring by, for example, brazing, and retain the semiconductor die within the annular insulation ring due to the pressure from the outside supports. Also, typically, such well-known compression assembled packages include a structure that allows a control signal to be carried from an external control circuit to a control electrode of the semiconductor die, whereby the semiconductor die may be switched ON to allow conduction between the poles of the package and OFF to prevent the conduction. Hence, compression assembled semiconductor packages find much use as switching or other circuit devices within an electronic circuit.

SUMMARY OF THE INVENTION

A compression assembled semiconductor package according to the present invention includes a semiconductor device which is in surface-to-surface electrical contact and secured between respective surfaces of a top pole piece and a bottom pole piece. An annular insulation ring, which is preferably made from a molded plastic, is disposed around the semiconductor die. The bottom pole piece and the top pole piece each include radially extending flanges which are force-fitted or inserted into appropriate grooves in the annular insulation ring. By means of a force application on the bottom pole piece and the top pole piece, the metallic flanges (or the insulation ring) elastically deform and are caused to be snapped into or inserted into receiving grooves in an interior wall of the annular insulation ring.

As a result of the compression force forcing the flanges into respective grooves, the semiconductor die is held in place within the annular insulation ring between the two pole pieces. Thus, a compression assembled semiconductor package according to the present can be more easily assembled than prior art packages, using fewer steps, and using fewer expensive parts without sacrificing electrical or thermal performance.

Other features and advantages of the present invention will become apparent from the following description of the invention which refers to the accompanying drawings.

BRIEF DESCRIPTION OF THE DRAWING(S)

FIG. 1 shows the top view of a compression assembled semiconductor package according to the present invention.

FIG. 2 shows the cross-section of a first embodiment of a compression assembled semiconductor package taken cross-section line 1—1 in FIG. 1.

FIG. 3 shows an enlargement of a portion of FIG. 2 with particular emphasis on a projection and a receiving groove.

DETAILED DESCRIPTION OF THE PREFERRED EMBODIMENT

Figure 4:
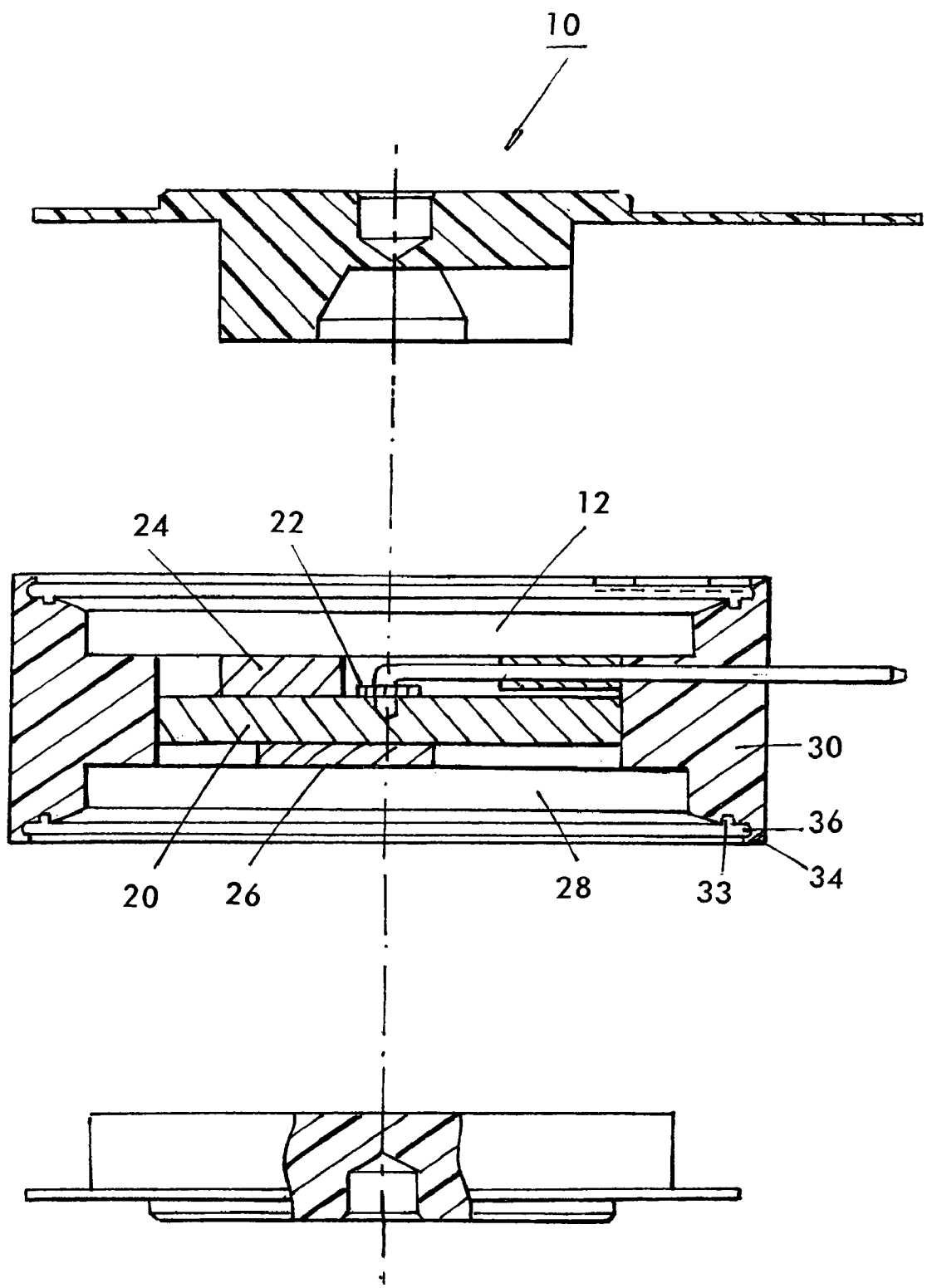
FIG. 4 is an exploded view of the first embodiment of a compression assembled semiconductor package according to the present invention.

Referring to the drawing figures, in which like reference numerals refer to like elements, there is shown in FIG. 1 a compression assembled semiconductor package 10. Package 10 includes top pole piece 12 which is preferably made from a conductor such as copper or a copper alloy and having good electrical conductivity.

Further, as shown in FIG. 1, control lead 14 extends radially outward from the body of compression assembled semiconductor package 10. Control lead 14 is connectable electrically to an external control circuit (not shown) which supplies control signals to the control electrode of a semiconductor die contained within compression assembled semiconductor package 10. Control lead 14 extends through the body of annular insulation ring 30 to the exterior thereof. Preferably, control lead 14 comprises a copper tab and is connected to control electrode 22 of semiconductor die 20 (see FIG. 2). Control lead 14 forms a control signal carrier that transmits from a control circuit control signals to control electrode 22 of semiconductor die 20.

FIG. 2 shows a cross-section of compression assembled semiconductor package 10 of FIG. 1 taken across section line 2—2 (FIG. 1) according to the first embodiment of the present invention. As shown in FIG. 2, compression assembled semiconductor package 10 includes a semiconductor die 20, which may be a diode, thyristor, a MOSFET, an IGBT or other suitable semiconductor device. Semiconductor die 20 includes control electrode 22 and first major electrode 24 disposed on a first major surface, and second major electrode 26 on an opposing major surface. Top pole piece 12 is in intimate electrical surface-to-surface contact with first major electrode 24 of semiconductor die 20; bottom pole piece 28 is in intimate, surface-to-surface, electrical contact with second major electrode 26 of semiconductor die 20. The intimate contact between the pole pieces and respective electrodes of semiconductor die 20 enables conduction between the poles of the package.

Also, as shown in FIG. 2, compression assembled semiconductor package 10 includes an annular insulation ring 30 which is disposed around semiconductor die 20. Insulation ring 30 is preferably molded from an insulating plastic material and is preferably formed using a transfer molding process. One material which has been used for ring 30 is Silicone Polymer VMQ. Top pole piece 12 and bottom pole piece 28 each include an annular flange 32 that is integrally connected to and radially extends from the outer surface of the pole pieces 12 and 28.

The annular flange 32 extending from top pole piece 12 and bottom pole piece 28 of compression assembled semiconductor package 10 includes rib 33 that extends radially from the outer surface thereof. The rib 33 and its respective pole piece (12, 28) is integrally connected and forms a unitary body with the annular flange 32. Further, and as shown in FIG. 2, extending from each rib 33 is projection 34 which is received in groove 36 of the annular insulation ring 30. Preferably, a force is applied on the pole pieces (12 and 28) causing the annular flange 32 to deform such that each projection 34 is received by groove 36. By setting each projection 34 in a respective groove 36, the semiconductor die is held in place between the two pole pieces.

FIG. 3 shows a close-up of the embodiment shown in FIG. 2, with particular emphasis on projection 34 and receiving groove 36. As shown in FIG. 3, the outlined portion that is shown circled in FIG. 3 refers to the same circled area of package 10 shown in FIG. 2. As shown in greater detail in FIG. 3, projection 34 which extends from rib 33, comprises a semi-circular distal end 38. Further, projection 34 includes a squared tab 40 that projects perpendicularly from the rib 33, and is interposed between rib 33 and distal end 38. Moreover, the receiving groove 36 of annular insulation ring 30 comprises cavity 42 which is adapted to receive the semi-circular distal end 38, and notch 44 that is adapted to receive squared tab 40. By means of a compression force applied to top pole piece 12 and bottom pole piece 28, the projection 34, comprising both the distal end 38 and squared tab 40, is received by groove 36 comprising cavity 42 and notch 44. The purpose of notch 44 is for a sealing ring. Thus, an intimate contact between the pole pieces and respective electrodes of semiconductor die 20 is provided as the pole pieces (12 and 28) and are held in place.

FIG. 4 shows an exploded perspective of the preferred embodiment of compression assembled semiconductor package 10. As shown in FIG. 4, package 10 includes an annular insulation ring 30 that is preferably made from molded plastic, control lead 14 extending through the body of annular insulation ring 30, semiconductor die 20, top pole piece 12 and bottom pole piece 28. Semiconductor die 20 is round and is disposed within the circular interior space of annular insulation ring 30. Projections 34, once a force is applied to top pole piece 12 and bottom pole piece 28, are received by grooves 36 thereby ensuring intimate contact between the pole pieces and respective electrodes of semiconductor die 20.

Figure 5:
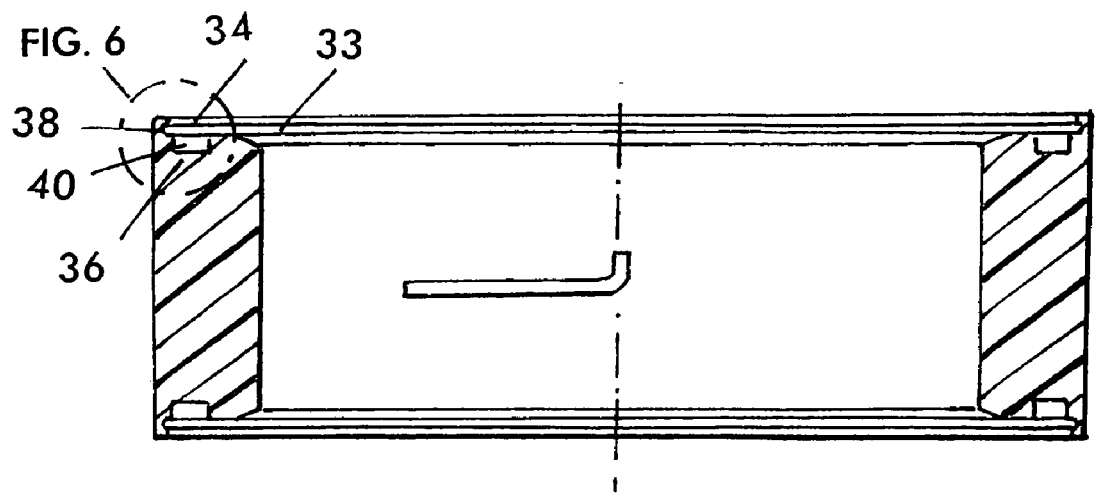
FIG. 5 shows the cross-section of a second embodiment of a compression assembled semiconductor package.
Figure 6:
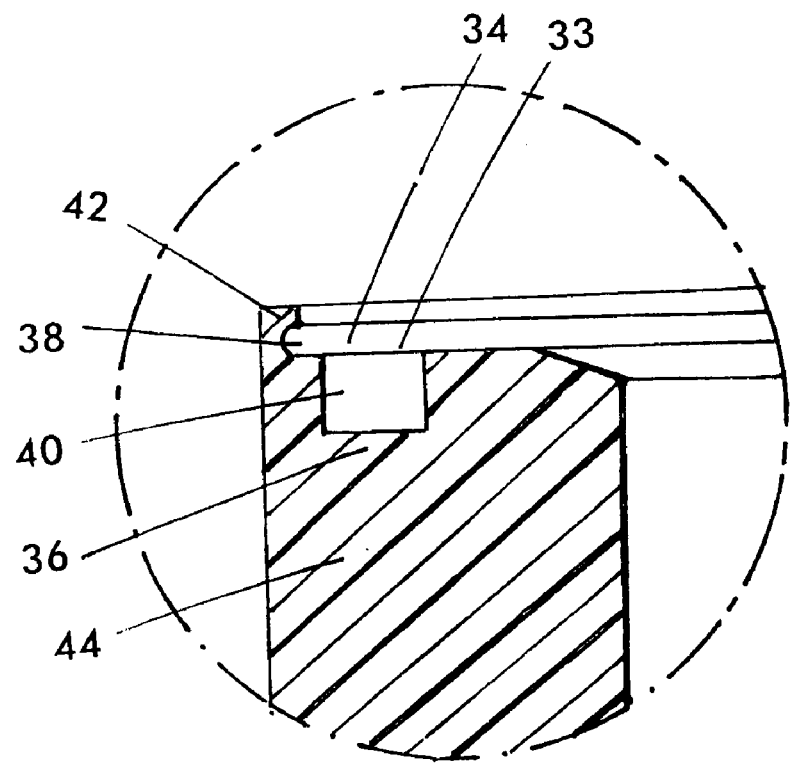
FIG. 6 shows an enlarged view of a portion of the compression assembled package of FIG. 5 with particular emphasis on a projection and a receiving groove.

FIGS. 5–8 show alternative embodiments of the present invention. In the embodiment shown in FIGS. 5 and 6, the length and width of squared tab 40 that extends from projection 34 is larger than that shown in the first embodiment, shown in FIGS. 3 and 4. Moreover, the semi-circular distal end 38 extends further from squared tab 40 in the embodiment shown in FIGS. 5 and 6 than in the embodiment shown in FIGS. 2, 3 and 4. Also as shown in FIGS. 5 and 6, squared tab 40 is coupled to rib 33, as opposed to being an extension of rib 33 as shown in FIGS. 2, 3 and 4. For example, in the embodiment shown in FIGS. 5 and 6, squared tab 40 is connected to rib 33 by ultrasonic bonding. Other variations or the dimension and shape of projection 34 and groove 36 are contemplated herein.

Figure 7:
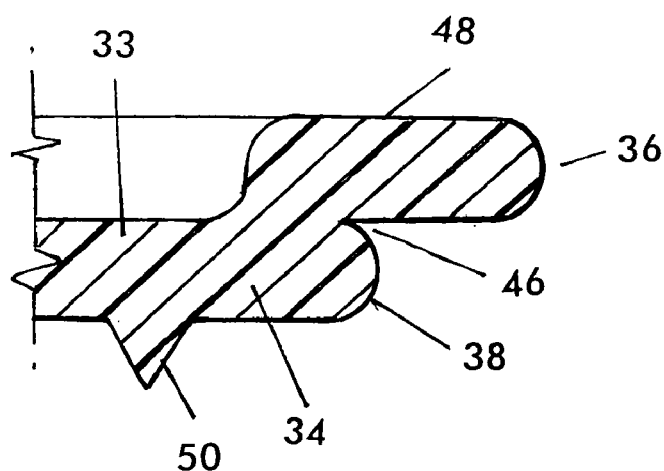
FIG. 7 shows an enlarged view of a portion of an alternative embodiment of the compression assembled package of FIG. 5.

FIG. 7 shows an alternative embodiment, particularly with respect to projection end 34 and receiving groove 36. As shown in FIG. 7, projection end 34, which extends from rib 33, comprises semicircular distal end 38 (FIG. 3), and further comprises reentrant cut 46 and stepped end 48 in order to provide additional support for the contact between the pole pieces and respective electrodes of semiconductor die 20. Moreover, tapered projection 50 extends from rib 33 and functions to provide still additional support once a force is applied to top pole piece 12 and bottom pole piece 28.

Figure 8:
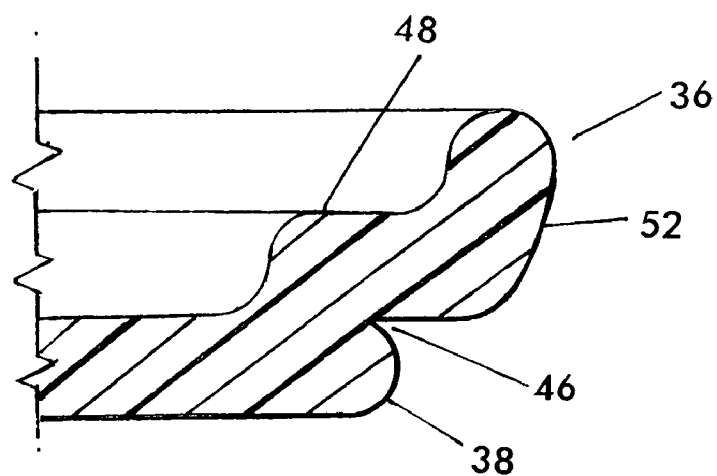
FIG. 8 shows an enlarged view of a portion of another alternative embodiment the compression assembled package of FIG. 5.

FIG. 8 shows yet another alternative embodiment that includes the stepped end 58, and further includes axillary projecting edge 52 that extends from stepped end 58. It is believed that axillary projecting edge 52 provides additional support with respect to a contact between the pole pieces and respective electrodes of semiconductor die 20. The embodiment shown in FIG. 8 does not include the tapered projection 50, shown in FIG. 7, as it is believed that axillary projecting edge 52 provides additional support. Of course, one skilled in the art will recognize that tapered projection 50 can be provided with axillary projecting end 52 in yet another alternative embodiment of compression assembled semiconductor package 10.

Figure 9:
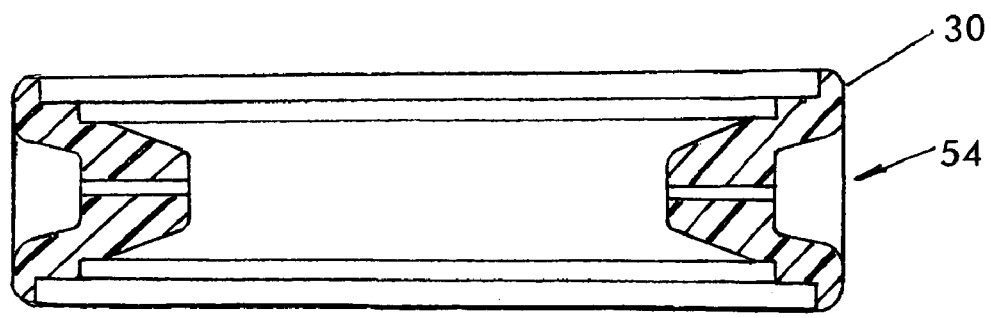
FIG. 9 shows a cross-section of an alternative configuration for a molded ring for a package according to the present invention.

FIG. 9 shows a cross-section of an alternative configuration for a molded ring for a package according to the present invention. In the embodiment shown in FIG. 9, an annular recess 54 is located substantially in the center of annular insulation ring 30.

As one skilled in the art could appreciate, other variations of the present invention are possible. For example, a compression assembled semiconductor package having an annular insulation ring 30 made from molded plastic can have one pole structured according to the fourth embodiment and be ultrasonically bonded to an end of annular insulation ring 30 and the other pole secured to the annular insulation ring by being embedded therein or connected to a flange that is embedded therein according to the first, second and third embodiments.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A compression assembled semiconductor package comprising:
   a semiconductor die having a first major surface and a second major surface;
   first and second electrodes disposed on said first and said second major surfaces, respectively;
   an insulation ring having an interior wall annularly disposed around and radially spaced from said semiconductor die, said interior wall having at least a first groove in a first end portion of said insulation ring, and said interior wall having a second groove in a second end portion of said insulation ring;

a first conductive pole having a body portion which is in surface-to-surface electrical contact with said first electrode and a first pole flange extending radially from said first pole, said first pole flange having a first extending projection;

a second conductive pole having a body portion which is in surface-to-surface electrical contact with said second electrode, and a second pole flange extending radially from said second pole, said second pole flange having a second extending projection;

a first rib extending from said first pole flange and a second rib extending from said second pole flange;

and wherein each of said first extending projection and said second extending projection comprises a squared tab and a semi-circular distal end, wherein said first extending projection is forced into said first groove, and said second extending projection is forced into said second groove; and said semiconductor die being held in place between said first pole and said second pole only as a function of compressing said first and second extending projections into said first and second grooves.

2. The compression assembled semiconductor package of claim 1, further comprising a control electrode disposed on a first major surface of said semiconductor die.

3. The compression assembled semiconductor package of claim 2, further comprising a control signal carrier extending through said insulation ring from the exterior thereof and having an end in electrical contact with said control electrode.

4. The compression assembled semiconductor package of claim 1, wherein said first extending projection and said second extending projection extend from said first rib and said second rib, respectively.

5. The compression assembled semiconductor package of claim 1, wherein at least one of said first groove and said second groove comprise at least one of a notch and a cavity.

6. The compression assembled semiconductor package of claim 1, wherein said first pole includes a groove to allow said control signal carrier to reach said control electrode.

7. The compression assembled semiconductor package of claim 1, wherein said semiconductor die is a thyristor.

8. The compression assembled semiconductor package of claim 1, wherein said first pole includes a connection tab extending radially away from its periphery.

9. The compression assembled semiconductor package of claim 1, wherein said control signal carrier comprises a control pin in electrical contact at one end thereof with said control electrode and electrically connected by a conductive strip to a lead that extends through the body of said molded plastic insulation ring.

10. The compression assembled semiconductor package of claim 1, wherein at least one of said first extending projection and said second extending projection comprises at least one of a tapered projection, a distal end, a reentrant cut, a stepped end and an axillary projecting edge.

* * * * *